United States Patent [19]
Nagase et al.

[11] Patent Number: 5,675,474
[45] Date of Patent: Oct. 7, 1997

[54] HIGHLY HEAT-RADIATING CERAMIC PACKAGE

[75] Inventors: Toshiyuki Nagase; Yoshio Kanda; Yoshiro Kuromitu; Masafumi Hatsushika; Hirokazu Tanaka, all of Omiya, Japan

[73] Assignee: Mitsubishi Materials Corporation, Tokyo, Japan

[21] Appl. No.: 503,243

[22] Filed: Jul. 17, 1995

[30] Foreign Application Priority Data

Jul. 15, 1994 [JP] Japan .................. 6-163724

[51] Int. Cl.$^6$ ............................................. H05K 7/20
[52] U.S. Cl. .............. 361/704; 174/16.3; 165/80.2; 165/80.3; 165/185; 257/678; 257/707; 257/712; 361/707; 361/708; 361/715
[58] Field of Search ........................... 165/80.2, 80.3, 165/80.4, 185; 174/16.3; 257/678, 680, 684, 722–724, 706, 707, 712, 713; 361/704, 706, 707, 709–711, 714–722, 730, 752

[56] References Cited

U.S. PATENT DOCUMENTS 5,297,006  3/1994  Mizukoshi .................. 361/704
5,455,382  10/1995 Kojima et al. ............... 257/722
5,513,070  4/1996  Xie et al. .................... 361/704

FOREIGN PATENT DOCUMENTS 4031733  4/1992  Germany ..................... 361/717

Primary Examiner—Gregory D. Thompson
Attorney, Agent, or Firm—Oblon, Spivak, McClelland, Maier & Neustadt, P.C.

[57] ABSTRACT

Highly heat-radiating ceramic packages comprising a multi-layer ceramic wiring board 11 to one surface of which is bonded a heat-radiating ceramic base plate 13 with first and second aluminum plates 31 and 32 bonded to both surfaces thereof, via the first aluminum plate 31 are free from warping and cracking, and have improved heat-radiation performance and lower weight and manufacturing cost. The ceramic base plate 13 and the multi-layer ceramic wiring board 11 may be constructed with the same or different types of ceramic which are selected from the group consisting of alumina, glass ceramic, aluminum nitride, mullite, and silicon carbide. The two aluminum plates 31 and 32 are bonded to the ceramic base plate 13 with an Al-Si brazing material. Improved levels of heat radiation performance are accomplished by bonding a heat-radiating ceramic base plate with an aluminum plate bonded thereto, to a multi-layer wiring board prepared even by low-temperature sintering.

9 Claims, 6 Drawing Sheets

HIGHLY HEAT-RADIATING CERAMIC PACKAGE

BACKGROUND OF THE INVENTION

1. Field of the Invention

The present invention relates to a highly heat-radiating ceramic package with a silicon semiconductor chip, etc. mounted therein. More particularly, it is concerned with a ceramic package which radiates heat generated in the package into the air to prevent temperature increase of the package.

2. Discussion of the Background

Hitherto known, highly heat-radiating ceramic packages include packages 1, 6, and 10 shown in FIGS. 9 through 11. As shown in FIG. 9, the ceramic package 1 comprises a multi-layer alumina ($Al_2O_3$) wiring board 2 to one surface of which is bonded a highly heat-conductive copper-tungsten (Cu-W) alloy plate 3 for heat radiation with a Ag brazing material. The multi-layer wiring board 2 is prepared by sintering a plurality of alumina layers 2a each having a tungsten conductor circuit 2b formed on its surface, at high temperatures on the order of 1600° C. The board 2 has a cavity 2c in its center which is open at the other surface, and a silicon semiconductor chip 4 is bonded to the ceiling of the cavity 2c using a Au-Si soldering material. This ceramic package 1 is designed so that the heat generated by the silicon semiconductor chip 4 is dissipated into the air through the Cu-W alloy plate 3 via the base plate 2.

Alternatively, as shown in FIG. 10, the ceramic package 6 is designed in such a manner that a multi-layer alumina wiring board 7 has a cavity 7c in its center which passes through the board 7, and the cavity 7c is plugged with a heat-radiating Cu-W alloy block 8 at its upper end. The multi-layer wiring board 7 is prepared in the same manner as the multi-layer wiring board 2 shown in FIG. 9, and a silicon semiconductor chip 4 is bonded to the bottom surface of the block 8 with a Au-Si soldering material.

Separately, as shown in FIG. 11, the ceramic package 10 is designed in such a manner that an aluminum fin 9 is attached to the top surface of the block 8 of the ceramic package 6 by engaging a vis 9a threadedly in a threaded hole 9b.

In these ceramic packages 6 and 10, the heat generated by the silicon semiconductor chip 4 is dissipated into the air through the block 8 or through the fin 9 via the block 8.

In addition, Japanese Unexamined Patent Application Disclosure HEI No. 6-69367 discloses a highly heat-radiating, integrated ceramic package which is prepared by laminating and sintering a plurality of ceramic layers which alternately sandwich metal layers for heat radiation. Part of the above-mentioned plurality of ceramic layers is bored to form a cavity which is open at the bottom of the package for mounting a silicon semiconductor chip therein by bonding. Further, the metal layers are placed in a state of electric disconnection from the conductor circuits placed on the surfaces of the ceramic layers. Selected as the metal of the metal layers is tungsten, molybdenum or the like which does not melt by the sintering and has a high heat conductivity.

The above-mentioned ceramic package allows effective radiation of the heat generated by the silicon semiconductor chip mounted in the cavity by bonding, toward the sides of the package through the metal layers. In addition, since the metal layers are sintered with the ceramic layers into an integral construction, the heat of the ceramic layers is readily conducted to the metal layers, thus improving the heat radiation performance of the package.

All the above-mentioned ceramic packages of the prior art, however, comprise a plate material, block or metal layer for heat radiation which is made of a Cu-W alloy, tungsten, molybdenum or the like which has a relatively high specific gravity and is expensive, and thus they have the inconvenience of greater total weight of the packages and increased manufacturing cost.

In the case of the finned ceramic package shown in FIG. 11, the silicone grease coat applied between the Cu-W alloy block 8 and the aluminum fin 9 has a high heat resistance which prevents efficient transfer of the heat from the block to the fin 9, and as a further problem, much time is required for the formation of threaded holes 9b in the block B.

Meanwhile, attention has recently been focused on multi-layer wiring boards which are prepared by using glass ceramic with a low dielectric constant and good high-frequency characteristics as the substrate material and Ag, Au or the like as the wiring material. In view of the melting point of Ag or Au, multi-layer wiring boards are constructed with glass ceramic which sinters in the air at a relatively low temperature on the order of 850°–900° C. However, attempts to bond the above-mentioned Cu-W alloy to such type of multi-layer wiring board in a reducing atmosphere at a temperature on the order of 820° C. using a Ag brazing material have failed in establishing substantial bonding between a multi-layer wiring board and a Cu-W alloy block for heat radiation due to lower bonding strength of the conductor circuit made of Ag or Au which is provided on the multi-layer wiring board.

SUMMARY OF THE INVENTION

Accordingly, it is one object of the present invention to provide a highly heat-radiating ceramic package which is free from warping and cracking, and has improved heat-radiation performance and lower weight and manufacturing cost.

It is another object of the present invention to provide a highly heat-radiating ceramic package with an improved level of heat radiation performance through low-temperature bonding of an aluminum plate attached to a heat-radiating ceramic base, which may even be applied to a multi-layer wiring board prepared by low-temperature sintering.

These and other objects, which will become apparent during the following detailed description, have been achieved by the inventors' discovery that highly heat-radiating ceramic packages which comprise a multi-layer ceramic wiring board to one surface of which is bonded a heat-radiating ceramic base plate with a first aluminum plate and a second aluminum plate bonded to both surfaces thereof, via a first aluminum plate with an Al-Si brazing material in which the ceramic base plate and the multi-layer ceramic wiring board is constructed with the same or different types of ceramic which are selected from the group consisting of alumina, glass ceramic, aluminum nitride, mullite, and silicon carbide solve the above-mentioned problems.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
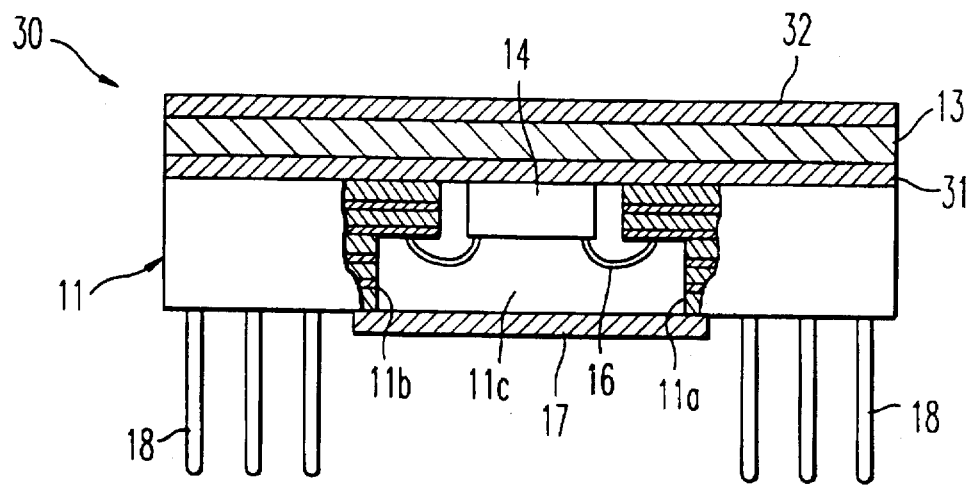
FIG. 1 is a cross sectional view of the main portion of each of the highly heat-radiating ceramic packages of Examples 1–25 according to the present invention.

The highly heat-radiating ceramic packages 30, 50, 70, and 90 according to the present invention which are shown in FIGS. 1 through 4 each comprise a multi-layer ceramic wiring board 11 to one surface of which is bonded a heat-radiating ceramic base plate 13 with a first aluminum plate 31 and a second aluminum plate 32 or 72 bonded to both surfaces thereof, via a first aluminum plate 31 with an Al-Si brazing material, wherein the ceramic base plate 13 and the multi-layer ceramic wiring board 11 may be constructed with the same or different types of ceramic which are selected from the group consisting of alumina, glass ceramic, aluminum nitride, mullite, and silicon carbide.

Here, the two aluminum plates 31 and 32 (or 72) are bonded to the ceramic base plate 13 with an Al-Si brazing material. The constituent ceramic of the ceramic base plate 13 is selected from the group consisting of alumina, glass ceramic, aluminum nitride, mullite, and silicon carbide, and the constituent ceramic of the multi-layer ceramic wiring board 11 is selected from the group consisting of alumina, glass ceramic, aluminum nitride, mullite, and silicon carbide as well. The constituent ceramics of the heat-radiating ceramic base plate 13 and the multi-layer ceramic wiring board 11 may be the same or different members of the above-mentioned ceramic groups. For example, in cases where the constituent ceramic of the multi-layer ceramic wiring board 11 is alumina, the ceramic base plate 13 may be constructed with any ceramic selected, as desired, from the group consisting of alumina, glass ceramic, aluminum nitride, mullite, and silicon carbide. The glass ceramic has a composition prepared by adding one to three types of additives which are selected from the group consisting of $P_2O_5$, $Li_2O$, $B_2O_3$, $ZrO_2$, $ZnO$, $TiO_2$, and $SnO_2$, to cordierite ceramics ($2MgO.2Al_2O_3.5SiO_2$), or a composition prepared by adding $P_2O_5$, $BaO$, $ZnO$, $K_2O$, etc. to β-spodumene ($Li_2O.Al_2O_3.4SiO_2$). These types of glass ceramics all are capable of being sintered at lower temperatures on the order of 850°–1050° C., and have low dielectric constants and low thermal expansion coefficients.

The highly heat-radiating ceramic packages 30, 50, 70, and 90 according to the present invention each have a total thickness of the first aluminum plate 31 and the second aluminum plate 32 which is 10–200% of the thickness of the heat-radiating ceramic base plate 13. For example, if the thickness of the heat-radiating ceramic base plate is 1.0 mm, then the total thickness of the aluminum plates 31 and 32 is within the range of 0.1 to 2.0 mm. In cases where the total thickness is 10% or less of the thickness of the heat-radiating base plate, the heat radiation performance of the package which relies on the aluminum plates is impaired, whereas in cases where the percentage exceeds 200%, the heat-radiating ceramic base plate tends to warp or crack upon relief of the stress after bonding. Preferably, the thickness of the heat-radiating ceramic base plate 13 is within the range of 0.1 to 1.0 mm. In cases where this thickness is lower than 0.1 mm, insulating properties of the base plate tend to be impaired, and its mechanical strength also tends to be lower. With a thickness over 1.0 mm, the total weight of the package tends to increase since the total thickness of the aluminum plates must be increased accordingly.

Figure 2:
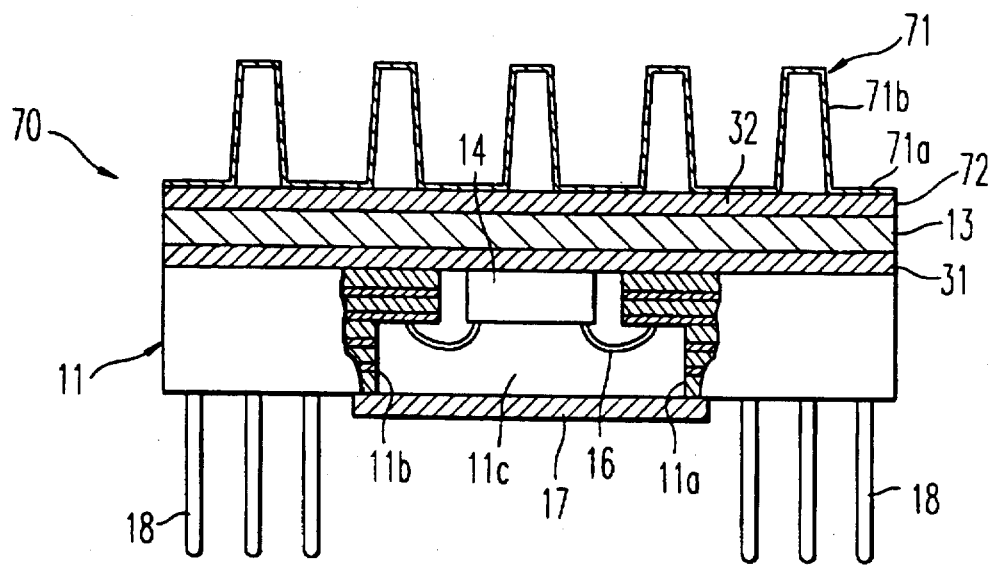
FIG. 2 is a cross sectional view of the main portion of the highly heat-radiating ceramic package of Example 26 according to the present invention.
Figure 4:
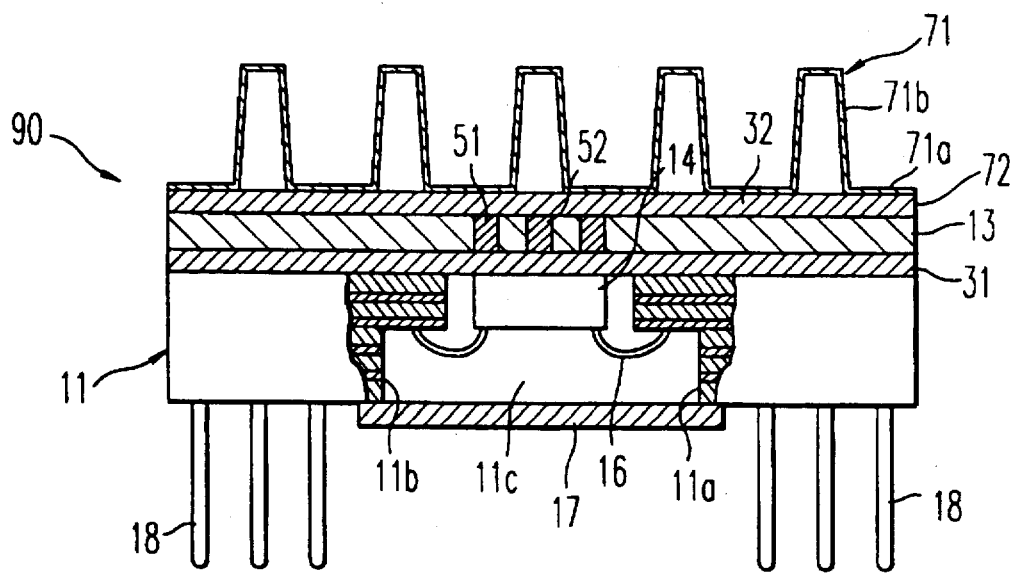
FIG. 4 is a cross sectional view of the main portion of the highly heat-radiating ceramic package of Example 28 according to the present invention.
Figure 6:
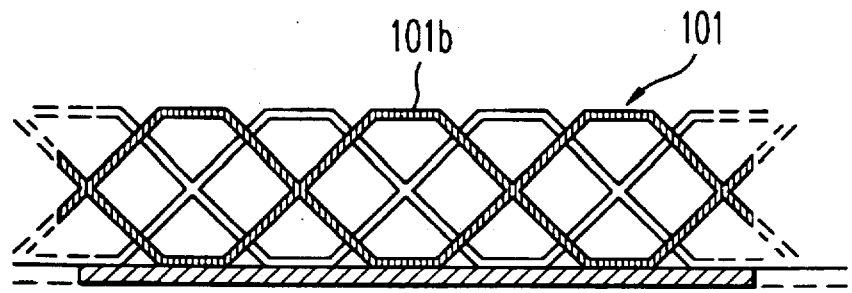
FIG. 6 is a cross sectional view of the main portion of a corrugated fin according to the present invention.
Figure 7:
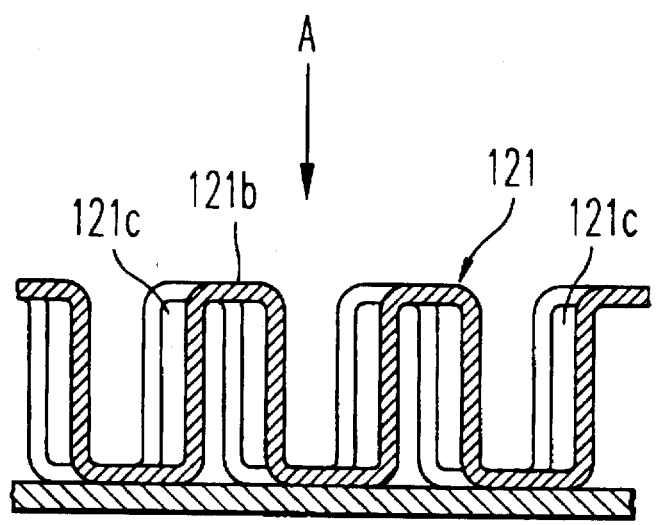
FIG. 7 is a cross sectional view of the main portion of another corrugated fin according to the present invention.
Figure 8:
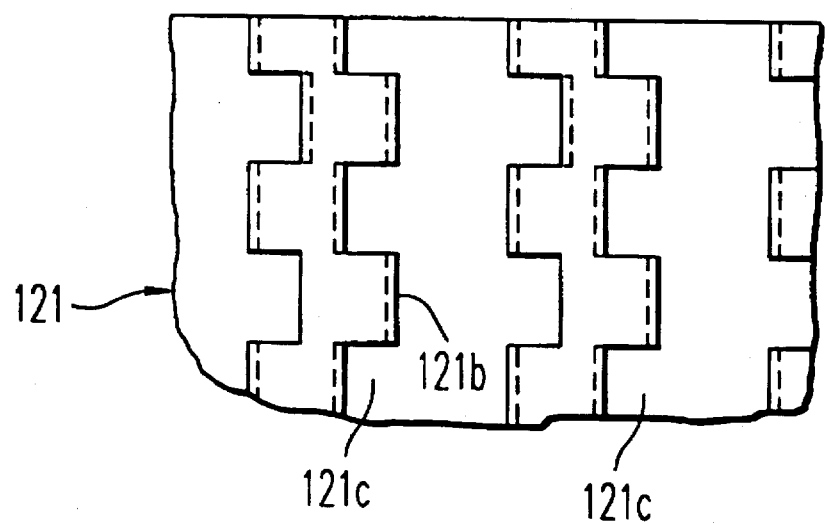
FIG. 8 is a perspective view of the main portion shown in FIG. 7, taken when viewed from the direction indicated by the arrow A in FIG. 7.

The highly heat-radiating ceramic packages 70 and 90 shown in FIG. 2 and FIG. 4 each comprise a heat-radiating fin 71 which is made of an aluminum material and is bonded to the heat-radiating surface of the ceramic base plate 13 via a second aluminum plate 72, with an Al-Si brazing material. Representative embodiments of this heat-radiating fin 71 include a corrugated aluminum fin 71 the main sections 71b of which have no windows along their heights and have two open sides. Other embodiments of the heat-radiating fin are a corrugated honey-comb aluminum fin 101 whose main sections 101b have a honey-comb section, as shown in FIG. 6; a corrugated louver aluminum fin 121 whose main sections 121b have a plurality of windows 121c formed along their heights and two open side ends, as shown in FIG. 7 and FIG. 8; or, though not shown, a pin type fin with a plurality of upright aluminum pins.

In cases where the heat-radiating fin 71, 101, or 102 is bonded to the second aluminum plate 72, the second aluminum plate 72 may be thinner than the first aluminum plate 31. Specifically, the thickness of the second aluminum plate 72 may be 70% or less of the thickness of the first aluminum plate 31.

Figure 3:
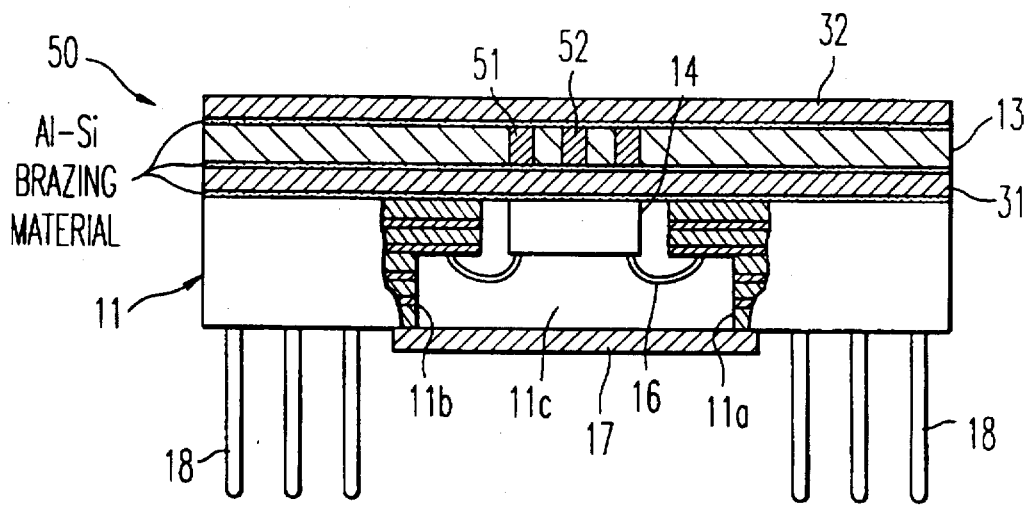
FIG. 3 is a cross sectional view of the main portion of the highly heat-radiating ceramic packages of Example 27 according to the present invention.

The highly heat-radiating ceramic packages 50 and 90 according to the present invention which are shown in FIG. 3 and FIG. 4 each comprise a ceramic base plate 13 with a heat-conducting through-hole 51 filled with an aluminum material 52. The multi-layer wiring board 11 has a cavity 11c which is open at the bottom surface of the board 11, and a plurality of heat-conducting through-holes 51 are provided through the ceramic base plate 13, facing the cavity 11c in cases where a silicon semiconductor chip 14 is bonded to the ceiling of the cavity 11c. The aluminum material 52 charged in the through-holes 51 is placed in contact with the aluminum plates 31 and 32 (or 72).

The highly heat-radiating ceramic packages 30, 50, 70, and 90 according to the present invention which are shown in FIGS. 1 through 4 each comprise the multi-layer ceramic wiring board 11 to the other surface of which are bonded a plurality of I/O pins 18 with an Al-Si brazing material. These I/O pins are bonded thereto simultaneously when the aluminum plate-fitted ceramic base plate 13 is bonded to the multi-layer wiring board 11.

Figure 5:
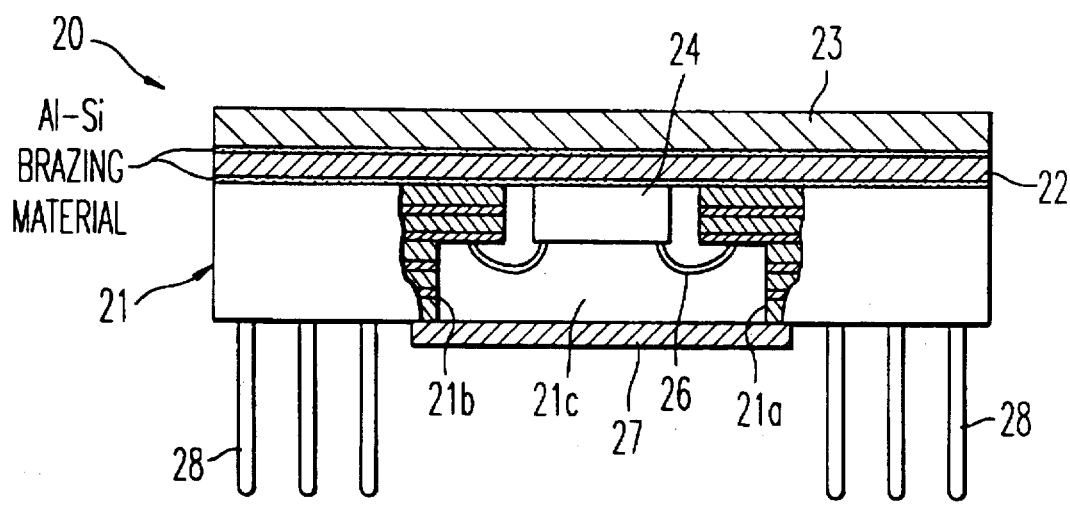
FIG. 5 is a cross sectional view of the main portion of the highly heat-radiating ceramic package of Example 29 according to the present invention.

The highly heat-radiating ceramic package 20 according to the present invention which is shown in FIG. 5 comprises a heat-radiating aluminum base plate 23 which is bonded to one surface of a multi-layer alumina wiring board 21 via an aluminum plate 22 using an Al-Si brazing material as the bonding material. Preferably, the bonding method includes preparation of the heat-radiating alumina base plate 23 with the aluminum plate 22 bonded to one surface thereof with the Al-Si brazing material, and subsequent bonding of the thus prepared alumina base plate 23 to one surface of the multi-layer alumina wiring board 21 via the aluminum plate 22 using the Al-Si brazing material.

In the highly heat-radiating ceramic package 20, the thickness of the aluminum plate 22 is 10–100% of the thickness of the heat-radiating alumina base plate 23. This numerical range has been established for the same reason as that described above for the highly heat-radiating ceramic packages 30, 50, 70, and 90. Preferably, the thickness of the alumina base plate 23 is within the range of 0.1 to 2.0 mm as that of the ceramic base plate 13.

Though not shown, the highly heat-radiating ceramic package according to an embodiment of the present invention may comprise a heat-radiating fin made of an aluminum material which is bonded to the heat-radiating surface of the heat-radiating alumina base plate 23 with an Al-Si brazing material. Available for use as this heat-radiating fin are those fins shown in FIG. 2, FIG. 4 and FIGS. 6 through 8.

The highly heat-radiating ceramic package 20 of the present invention comprises the multi-layer alumina wiring board 21 to the other surface of which are bonded a plurality of I/O pins 28 with an Al-Si brazing material. In the same manner as the I/0 pins 18, these I/0 pins 28 are bonded to the multi-layer wiring board 21 simultaneously when the aluminum plate-fitted alumina base plate 23 is bonded to the board 21.

Illustrative embodiments of the Al-Si brazing material used as the bonding material according to the present invention include Al/7.5% Si foil, Al/13% Si foil, Al/9.5% Si/1.0% Mg foil, Al/7.5% Si/10% Ge foil, etc.; % all by weight, and this applies hereunder as well unless otherwise indicated.

As shown in FIGS. 1 through 5, provision of the cavity 11c or 21c in the multi-layer wiring board 11 or 21 allows bonding of the silicon semiconductor chip 14 or 24 to the aluminum plate 31 or 22 with an Al-Si brazing material. An alternative method of bonding the silicon semiconductor chip may include formation of a cavity-facing hole for receiving the silicon semiconductor chip in the center of the aluminum plate in such a manner that the hole provides some play to the chip, and bonding of the silicon semiconductor chip to the part of the heat-radiating ceramic base plate facing the hole, with an Al-Si brazing material. This configuration allows complete insulation of the back surface of the silicon semiconductor chip.

In the highly heat-radiating ceramic package 30 according to the present invention which is shown in FIG. 1, the constituent ceramic of the heat-radiating ceramic base plate 13 and the constituent ceramic of the multi-layer wiring board 11 may be different and thus may have different thermal expansion coefficients. Even in this case, however, the aluminum plates 31 and 32 bonded to both sides of the ceramic base plate 13 prevent warping and cracking of the base plate 13 after bonding and function as stress relief layers when thermal stress is exerted thereon. As a result, the package 30 does not suffer from warping and cracking even with change in temperature after bonding. Additionally, sandwiching of the ceramic base plate 13 between the two aluminum plates 31 and 32 reinforces the base plate 13 in a well-balanced manner, thus providing the package 30 with high strength. Further, the heat generated in the package 30 diffuses throughout the first aluminum plate 31 which has a high heat conductivity, transfers to the second aluminum plate 32 which also has a high heat conductivity via the Al-Si brazing material and the ceramic base plate 13, and further diffuses throughout the second aluminum plate 32, and finally is dissipated into the air through the top and side surfaces of the aluminum plate 32 and the side surfaces of the ceramic base plate 13, the aluminum plate 31 and the multi-layer ceramic wiring board 11. In the highly heat-radiating ceramic package 70 according to the present invention which is shown in FIG. 2, the heat which has diffused throughout the above-described aluminum plate 32 is dissipated into the air through the heat-radiating fin 71 which has a large surface area, via the Al-Si brazing material.

In the highly heat-radiating ceramic package 50 according to the present invention which is shown in FIG. 3, the heat generated in the package 50 diffuses throughout the first aluminum plate 31, transfers to the second aluminum plate 32 via the aluminum material 52 charged in the heat-conducting through-hole 51 and the Al-Si brazing material, and further diffuses throughout the second aluminum plate 32, and finally is dissipated into the air through the top and side surfaces of the aluminum plate 32 and the side surfaces of the ceramic base plate 13, the aluminum plate 31 and the multi-layer ceramic wiring board 11. In the highly heat-radiating ceramic package 90 according to the present invention which is shown in FIG. 4, the heat which has diffused throughout the above-described aluminum plate 72 is dissipated into the air through the heat-radiating fin 71 which has a large surface area, via the Al-Si brazing material.

The highly heat-radiating ceramic package 20 according to the present invention which is shown in FIG. 5 does not suffer from warping and cracking even with change in temperature after bonding, since the aluminum plate 22 is sandwiched between the base plate 23 and the board 21 both composed of alumina. The heat generated in the package 20 diffuses throughout the aluminum plate 22 which has a high heat conductivity, transfers thereafter to the alumina base plate 23 and the multi-layer alumina wiring board 21 which have low heat conductivities via the Al-Si brazing material, and is dissipated into the air through their outer surfaces.

Other features of the invention will become apparent in the course of the following descriptions of exemplary embodiments which are given for illustration of the invention and are not intended to be limiting thereof.

EXAMPLES

Examples of the present invention and Comparisons therewith will now be explained in detail with reference to the accompanying drawings, wherein like reference numerals designate identical or corresponding parts throughout the several views.

EXPLANATION OF THE REFERENCE CHARACTERS

| | |
|---|---|
| 20, 30, 50, 70, 90 | Highly heat-radiating ceramic package |
| 11 | Multi-layer ceramic wiring board |
| 13 | Heat-radiating ceramic base plate |
| 18 | I/O pin |
| 21 | Multi-layer alumina wiring board |
| 22 | Aluminum plate |

-continued

| | |
|---|---|
| 23 | Heat-radiating alumina base plate |
| 28 | I/O pin |
| 31 | First aluminum plate |
| 32, 72 | Second aluminum plate |
| 51 | Heat-conducting through-hole |
| 52 | Thermal via hole (aluminum material) |
| 71 | Corrugated fin (heat-radiating fin) |
| 101 | Corrugated honey-comb fin (heat-radiating fin) |
| 121 | Corrugated louver fin (heat-radiating fin) |

Examples 1–25

As shown in FIG. 1, a ceramic package 30 was prepared by simultaneous bonding of a heat-radiating ceramic base plate 13 with aluminum plates 31 and 32 bonded to both surfaces thereof, a multi-layer ceramic wiring board 11 and a plurality of I/O pins 18. Specifically, twenty-five types of ceramic packages 30 were prepared based on the combinations of the five types of heat-radiating ceramic base plates listed in Table 1 and the five types of multi-layer ceramic wiring boards 11 listed in Table 1 as well. Here, "LOW-TEMPERATURE SINTERING SUBSTRATE 951" manufactured by Du Pont was used as the glass ceramic listed in Table 1.

The multi-layer ceramic wiring board 11 was prepared by laminating a plurality of ceramic green sheets which had been screen-printed with conductive paste, and sintering the laminated multi-layer product at a temperature on the order of 850°–1600° C. The reference character 11b indicates a conductor, and 11a indicates a ceramic layer. The type of conductor and the sintering temperature were determined based on the particular constituent ceramic of the board 11. For example, in cases where the multi-layer wiring board 11 was composed with glass ceramic, the conductor was a paste of the Ag family and sintering was performed at 875° C. In cases where the board 11 was composed with alumina, tungsten paste was selected and sintering was performed at 1600° C. The multi-layer ceramic wiring board 11 has a length of 40 mm, a width of 40 mm and a thickness of 2.0 mm, and a cavity 11c was bored in the center of the board 11. The aluminum plates 31 and 32 are each composed with an aluminum alloy containing 97% or more aluminum. The aluminum plates 31 and 32 and the ceramic base plate 13 all have the same planar contours as the multi-layer wiring board 11, which are defined by a length of 40 mm and a width of 40 mm. The thicknesses of the aluminum plates 31 and 32 are both 0.4 mm, while the ceramic base plate 13 has a thickness of 0.635 mm; the total thickness of the aluminum plates 31 and 32 is approximately 126% of the thickness of the ceramic base plate 13.

The aluminum plates 31 and 32 were laminated on both surfaces of the ceramic base plate 13, via 30 µm-thick Al/7.5% Si foil which had the same contour and two-dimensional size as the aluminum plates, and the resulting composite was heated in a vacuum furnace at 630° C. for 30 minutes under a load of 2 kgf/cm² to accomplish the bonding. The ceramic base plate 13 with the aluminum plates 31 and 32 bonded thereto was laid on one surface of the multi-layer wiring board 11 via 30 µm-thick Al/7.5% Si foil which had the same contour and two-dimensional size as the base plate 13, and the resulting composite was heated in a vacuum furnace at 630° C. for 30 minutes under a load of 2 kgf/cm² to accomplish the bonding. At the same time as this bonding, a plurality of I/O pins 18 made of KOVAR (trade name) were bonded to the other surface of the multi-layer wiring board 11 via an Al-Si brazing material. To the aluminum plate 31 facing the cavity 11c there was die-bonded a silicon semiconductor chip 14 using Al-Si solder at 420° C., and then wire bonding was performed with a Au wire 16 at 300° C. The cavity 11c was filled with nitrogen gas after evacuation of the air, in order to prevent oxidation of the chip 14 and the wire 16, and the cavity 11c was sealed with a cover plate 17 made of KOVAR.

Example 26

The ceramic package 70 shown in FIG. 2 comprises a heat-radiating alumina base plate 13 with a 0.2 mm-thick aluminum plate 72, which is thinner than the aluminum plate 32 shown in FIG. 1, bonded to the top surface thereof, with a corrugated fin 71 bonded to the top surface of the aluminum plate 72 via Al/7.5% Si foil. The total thickness of the aluminum plates 31 and 72 is approximately 94% of the thickness of the ceramic base plate 13. The other particulars of the configuration are the same as those of Example 1. The constituent ceramic of the multi-layer wiring board 11 is alumina. The fin 71 is formed with an aluminum alloy containing 87% or more aluminum. The corrugated fin 71 has bonding sections 71a which are bonded to the top surface of the aluminum plate 32, and a plurality of main fin sections 71b which are formed integrally with the bonding sections 71a and project upward, located laterally at a given spacing. The cross section of each of the main fin sections 71b is roughly shaped as an inverted "U", and both side ends of the main fin sections 71b are open. The corrugated fin 71 was bonded to the top surface of the aluminum plate 32 by heating the fin 71 placed on the top surface of the plate 32 via 60 µm-thick Al/7.5% Si foil sandwiched between them, in a vacuum furnace at 630° C. for 30 minutes under a load of 20 g/cm².

Example 27

The ceramic package 50 shown in FIG. 3 has a plurality of heat-conducting through-holes 51 in its section which faces the cavity 11c of the heat-radiating alumina base plate 13 shown in FIG. 1, and all these heat-conducting through-holes 51 are filled with an aluminum material 52. This aluminum material serves to provide thermal via holes. The other particulars of the configuration are the same as those in Example 1. The constituent ceramic of the multi-layer wiring board 11 is alumina. A total of nine through-holes 51 in a 3×3 matrix were provided by laser beam machining, each with a bore diameter of 0.6 mm. The aluminum material 52 was inserted into each of the through-holes 51, and the aluminum material 52 was connected to the aluminum plates 31 and 32 by bonding of the aluminum plate 31, the alumina base plate 13 and the aluminum plate 32, in the same manner as in Example 1.

Example 28

The ceramic package 90 shown in FIG. 4 comprises a heat-radiating alumina base plate 13 with a 0.2 mm-thick aluminum plate 72, which is thinner than the aluminum plate 32 shown in FIG. 3, bonded to the top surface thereof, with a corrugated fin 71 bonded to the top surface of the aluminum plate 72 via Al/7.5% Si foil. The total thickness of the aluminum plates 31 and 72 is approximately 94% of the thickness of the ceramic base plate 13. The other particulars of the configuration are the same as those of Example 27. The corrugated fin 71 is the same as the one used in Example 26, and is bonded to the top surface of the aluminum plate 72 in the same manner as in Example 26.

Example 29

The ceramic package 20 shown in FIG. 5 was prepared by simultaneous bonding of a heat-radiating alumina base plate 23 with an aluminum plate 22 bonded thereto, a multi-layer alumina wiring board 21 and a plurality of I/O pins 28. The multi-layer alumina wiring board 21 was prepared by laminating a plurality of alumina green sheets which had been screen-printed with conductive tungsten paste, and sintering the laminated multi-layer product at a temperature of 1600° C. The reference character 21b indicates a tungsten conductor, and 21a indicates a ceramic layer. The multi-layer alumina wiring board 21 has a length of 40 mm, a width of 40 mm and a thickness of 2.0 mm, and a cavity 21c was bored in the center of the board 21. The aluminum plate 22 is composed of an aluminum alloy containing 97% or more aluminum. The aluminum plate 22 and the alumina base plate 23 have the same planar contours as the multi-layer wiring board 21, which are defined by a length of 40 mm and a width of 40 mm. The thicknesses of the aluminum plate 22 and the alumina base plate 23 are 0.4 mm and 0.635 mm, respectively (the thickness of the aluminum plate 22 is approximately 63% of the thickness of the alumina base plate 23).

The aluminum plate 22 were laid on the alumina base plate 23, via 30 µm-thick Al/7.5% Si foil which had the same contour and two-dimensional size as the aluminum plate 22, and the resulting composite was heated in a vacuum furnace at 630° C. for 30 minutes under a load of 2 kgf/cm$^2$ to accomplish the bonding. The alumina base plate 23 with the aluminum plate 22 bonded thereto was laid on one surface of the multi-layer wiring board 21 via 30 µm-thick Al/7.5% Si foil which had the same contour and two-dimensional size as the base plate 23, and the resulting composite was heated in a vacuum furnace at 630° C. for 30 minutes under a load of 2 kgf/cm$^2$ to accomplish the bonding. At the same time as this bonding, a plurality of I/O pins 18 made of KOVAR were bonded to the other surface of the multi-layer wiring board 21 via an Al-Si brazing material.

To the surface of the aluminum plate 22 which faces the cavity 21c there was die-bonded a silicon semiconductor chip 24 using Al-Si solder at 420° C., and then wire bonding was performed with a Au wire 26 at 300° C. The cavity 21c was filled with nitrogen gas after evacuation of the air, in order to prevent oxidation of the chip 24 and the wire 26, and the cavity 21c was sealed with a cover plate 27 made of KOVAR.

Comparative Example 1

Figure 9:
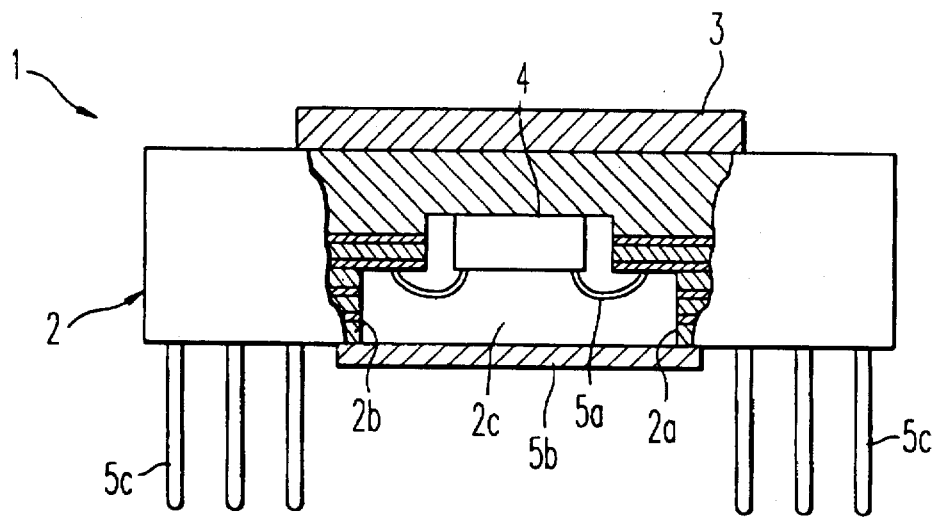
FIG. 9 is a cross sectional view of the main portion of the ceramic package of Comparison 1.

As shown in FIG. 9, the ceramic package 1 comprises a multi-layer alumina wiring board 2 which has been prepared by laminating and sintering a plurality of alumina layers 2a each having a tungsten conductor circuit 2b on its surface, and a Cu-W alloy plate 3 which has been bonded to the top surface of the board 2 via a Ag brazing material. In the center of the multi-layer wiring board 2 there is provided a cavity 2c which is open at the bottom surface of the board 2, and the same type of silicon semiconductor chip 4 as the one used in Example 1 is bonded to the ceiling of the cavity 2c via a Au-Si soldering material. The multi-layer wiring board 2 is sized to a length of 40 mm, a width of 40 mm and a thickness of 2.5 mm, while the Cu-W alloy plate 3 is sized to a length of 27 mm, a width of 27 mm and a thickness of 0.5 mm. The wire 5a and the cover plate 5b were the same types as those used in Example 1, and a plurality of I/O pins 5c were bonded to the bottom surface of the multi-layer wiring board 2 via a Ag-Cu brazing material.

Comparative Example 2

Figure 10:
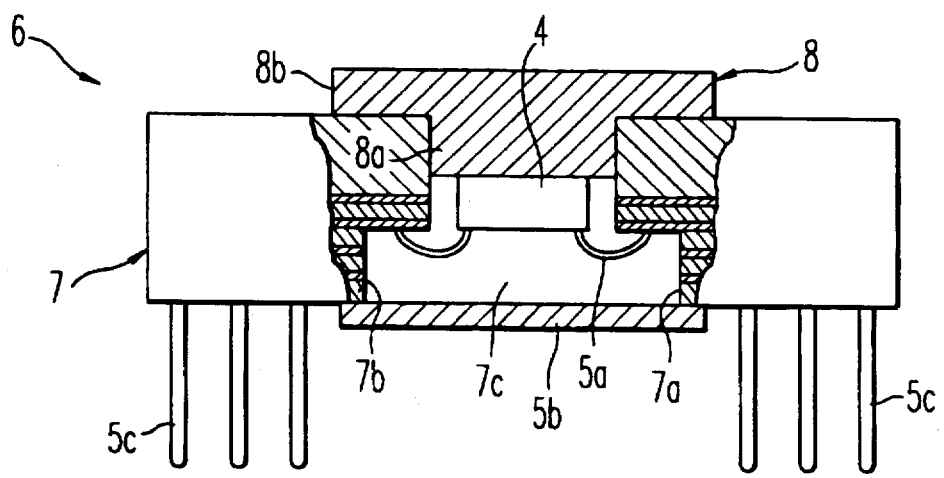
FIG. 10 is a cross sectional view of the main portion of the ceramic package of Comparison 2.

As shown in FIG. 10, the ceramic package 6 comprises a multi-layer alumina wiring board 7 which has been prepared by laminating and sintering a plurality of alumina layers 7a each having a tungsten conductor circuit 7b on its surface. The board 7 has a vertical through-cavity 7c in its center, and the cavity 7c is plugged with a Cu-W alloy block 8 at its upper end. This block 8 has an insertion section 8a and a flange section 8b which is placed in contact with the top surface of the multi-layer wiring board 7. This block 8 was bonded to the multi-layer wiring board 7 via a Ag-Cu brazing material, with the insertion section 8a inserted in the cavity 7c, while the same type of silicon semiconductor chip 4 as the one used in Comparative Example 1 was bonded to the bottom surface of the insertion section 8a inserted in the cavity 7c, by means of a Au-Si soldering material. The multi-layer wiring board 7 is sized to a length of 40 mm, a width of 40 mm and a thickness of 2.5 mm, the flange section 8b of the block 8 is sized to a length 16 mm, a width of 16 mm and a thickness of 0.5 mm, and the insertion section 8a is 1.0 mm in thickness. The wire 5a, the cover plate 5b and the plurality of I/O pins 5c are the same types as those used in Comparative Example 1, and were attached to the multi-layer wiring board 7 in the same manner as in Comparative Example 1.

Comparative Example 3

Figure 11:
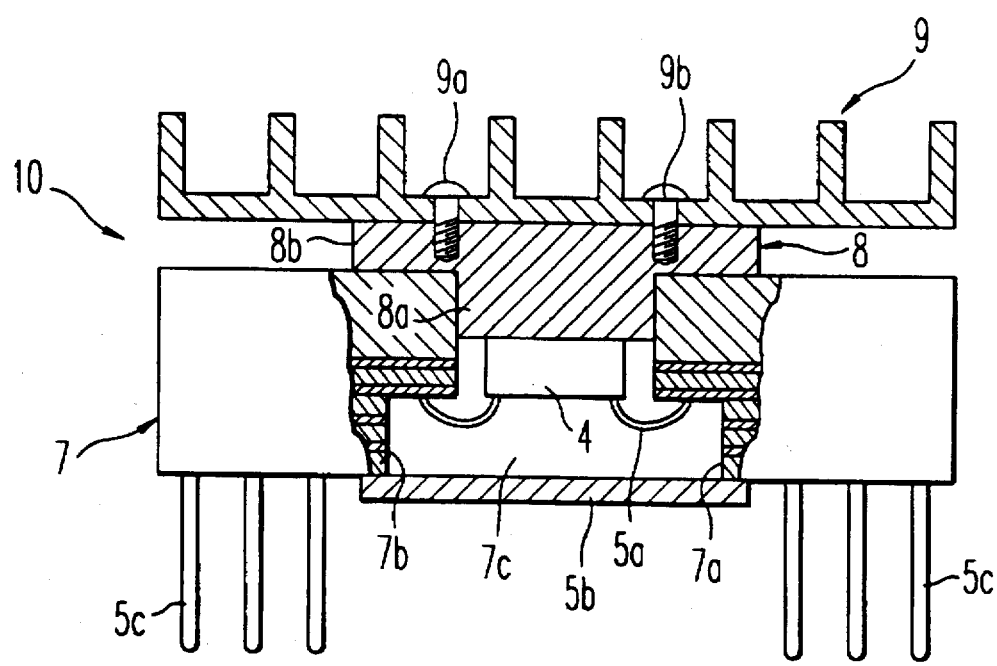
FIG. 11 is a cross sectional view of the main portion of the ceramic package of Comparison 3.

For the preparation of the ceramic package 10 shown in FIG. 11, an aluminum fin 9 was attached, with a vis 9a, to the top surface of the block 8 of the package 6 shown in Comparative Example 2, and a silicone grease coat was inserted between the block 8 and the fin 9.

Examples 30 and 31; and Comparative Examples 4 and 5

A ceramic package 30 was prepared in the same manner as in Example 1, except that the four values listed in Table 2 were used as the thicknesses of the aluminum plates 31 and 32 shown in FIG. 1, respectively. In addition, the multi-layer ceramic wiring board 11 and the heat-radiating ceramic base plate 13 were each constructed with alumina. The thickness of the heat-radiating ceramic base plate 13 was 0.635 mm.

Examples 32 and 33; and Comparative Examples 6 and 7

A ceramic package 20 was prepared in the same manner as in Example 29, except that the four values listed in Table 2 were used as the thicknesses of the aluminum plate 22 shown in FIG. 5. The thickness of the heat-radiating alumina base plate 23 was 0.635 mm.

Comparative Tests and Evaluations

Three watts of power was applied to each of the silicon semiconductor chips in the ceramic packages of Examples 1-33 and Comparative Examples 1-7 for heat generation, and the surface temperatures of the respective silicon semiconductor chips were measured with an infrared camera TVS-2000 (manufactured by Nihon Avionics). In addition, the total weight of each of the ceramic packages of Examples 1-33 and Comparative Examples 1-7 was measured. The results are shown in Table 1 and Table 2.

TABLE 1

|  | Constituent ceramic of multi-layer wiring board | Constituent ceramic of heat-radiating ceramic base plate | Chip surface temp. (°C.) | Package weight (g) |
|---|---|---|---|---|
| Example 1 | Alumina | Alumina | 50 | 17.5 |
| Example 2 | " | Glass ceramic | 54 | 16.7 |
| Example 3 | " | Aluminum Nitride | 45 | 16.9 |
| Example 4 | " | Mullite | 53 | 16.7 |
| Example 5 | " | Silicon Carbide | 44 | 16.8 |
| Example 6 | Glass ceramic | Alumina | 50 | 15.3 |
| Example 7 | " | Glass ceramic | 55 | 14.6 |
| Example 8 | " | Aluminum Nitride | 48 | 14.7 |
| Example 9 | " | Mullite | 54 | 14.6 |
| Example 10 | " | Silicon Carbide | 46 | 14.7 |
| Example 11 | Aluminum nitride | Alumina | 46 | 15.9 |
| Example 12 | " | Glass ceramic | 50 | 15.1 |
| Example 13 | " | Aluminum Nitride | 41 | 15.3 |
| Example 14 | " | Mullite | 50 | 15.1 |
| Example 15 | " | Silicon Carbide | 40 | 15.2 |
| Example 16 | Mullite | Alumina | 51 | 15.3 |
| Example 17 | " | Glass ceramic | 55 | 14.5 |
| Example 18 | " | Aluminum Nitride | 48 | 14.7 |
| Example 19 | " | Mullite | 54 | 14.5 |
| Example 20 | " | Silicon Carbide | 46 | 14.6 |
| Example 21 | Silicon Carbide | Alumina | 45 | 15.6 |
| Example 22 | " | Glass ceramic | 48 | 14.8 |
| Example 23 | " | Aluminum Nitride | 40 | 15.0 |
| Example 24 | " | Mullite | 48 | 14.8 |
| Example 25 | " | Silicon Carbide | 39 | 14.9 |
| Example 26 | Alumina | Alumina | 48 | 17.0 |
| Example 27 | " | " | 45 | 19.5 |
| Example 28 | " | " | 43 | 19.3 |
| Example 29 | " | " | 60 | 16.7 |
| Comparative Example 1 | Alumina | — | 80 | 19.2 |
| Comparative Example 2 | " | — | 60 | 20.0 |
| Comparative Example 3 | " | — | 50 | 39.2 |

TABLE 2

|  |  | Thickness (mm) of Al plate 31 or 22 | Thickness (mm) of Al plate 32 | Ratio by thickness (%) | Chip surface temp. (°C.) | Package weight (g) | Package cracking |
|---|---|---|---|---|---|---|---|
| Example | 30 | 0.1 | 0.1 | 31 | 75 | 15.8 | None |
| Example | 31 | 0.6 | 0.6 | 189 | 48 | 22.0 | None |
| Comparative | 4 | 0.03 | 0.03 | 9 | 110 | 16.4 | None |
| Example | 5 | 1.0 | 1.0 | 315 | — | 25.5 | Present |
| Example | 32 | 0.1 | — | 16 | 80 | 16.3 | None |
| Example | 33 | 1.0 | — | 157 | 50 | 21.1 | None |
| Comparative | 6 | 0.05 | — | 8 | 110 | 16.5 | None |
| Example | 7 | 1.5 | — | 236 | — | 23.3 | Present |

As is apparent from the data given in Table 1 and Table 2, the ceramic packages of Examples 1–33 were more lightweight than the ceramic packages of Comparative Examples 1–7, and further the former packages had the same or higher levels of heat-radiating performance than the latter packages.

Particularly, in cases where the aluminum plate was excessively thinner than the heat-radiating ceramic base plate or the heat-radiating alumina base plate as in Comparative Examples 4 and 6, the ceramic packages had low levels of heat-radiating performance, and the ceramic packages had cracks in cases where the aluminum plate was excessively thicker than the heat-radiating ceramic base plate or heat-radiating alumina base plate as in Comparative Examples 5 and 7.

As described above, since a heat-radiating ceramic base plate is bonded to a multi-layer ceramic wiring board via an aluminum plate using an Al-Si brazing material according to the present invention, the aluminum plate efficiently dissipates the heat generated in the multi-layer wiring board. Sandwiching of the heat-radiating ceramic base plate between two aluminum plates bonded thereto contributes to increased levels of heat-radiating performance and allows prevention of warping and cracking of the heat-radiating ceramic base plate even in cases where the constituent ceramic of the multi-layer ceramic wiring board and the constituent ceramic of the heat-radiating ceramic base plate are different types and thus have different thermal expansion coefficients, and therefore the ceramic packages do not suffer from warping and cracking.

Further, the use of a more lightweight aluminum material as the heat-radiating metal instead of the conventional materials such as Cu-W alloys, tungsten, molybdenum, etc. presents the additional advantage of lowered weight and manufacturing cost. In addition, the heat-radiating characteristics can be further improved by providing a plurality of heat-conducting through-holes passing through the heat-radiating ceramic base plate and filling these through-holes with an aluminum material to form thermal via holes. Furthermore, the heat-radiating characteristics can be improved markedly by bonding a heat-radiating fin made of an aluminum material to the heat-radiating surface of the second aluminum plate using an Al-Si brazing material.

It is further to be noted that since the Al-Si brazing material performs its bonding function at temperatures within the range of 600°–650° C., a multi-layer wiring board prepared by sintering glass ceramic layers at approximately 850° C. is bonded to the heat-radiating ceramic base plate via the aluminum plate with an Al-Si brazing material, without thermally impairing the conductor circuit of the multi-layer wiring board.

This application is based on Japanese Patent Applications HEI 6-152636, filed Jun. 9, 1994, and HEI 6-163724, filed Jul. 15, 1994, which are incorporated herein by reference in their entirety.

Obviously, numerous modifications and variations of the present invention are possible in light of the above teachings. It is therefore to be understood that, within the scope of the appended claims, the invention may be practiced otherwise than as specifically described herein.

What is claimed as new and is desired to be secured by letters patent of the United States is:

1. A highly heat-radiating ceramic package comprising:
   a multi-layer ceramic wiring board;
   a heat-radiating ceramic base plate;
   a first aluminum plate bonded to one surface of said heat-radiating ceramic base plate using an Al-Si brazing material;
   a second aluminum plate bonded to the other surface of said heat-radiating ceramic base plate using an Al-Si brazing material; wherein
   said multi-layer ceramic wiring board is bonded to said first aluminum plate using an Al-Si brazing material, wherein said first aluminum plate is between said multi-layer wiring board and said heat-radiating ceramic base plate; and
   said multi-layer ceramic wiring board and said heat-radiating ceramic base plate being constructed with the same or different types of ceramic which are selected from the group consisting of alumina, glass ceramic, aluminum nitride, mullite, and silicon carbide.

2. A highly heat-radiating ceramic package as claimed in claim 1, wherein the total thickness of said first aluminum plate and said second aluminum plate is 10–200% of the thickness of said heat-radiating ceramic base plate.

3. A highly heat-radiating ceramic package as claimed in claim 1, wherein a heat-radiating fin made of an aluminum material is bonded to said second aluminum plate with an Al-Si brazing material, wherein said second aluminum plate is between said heat-radiating fin and said heat-radiating ceramic base plate.

4. A highly heat-radiating ceramic package as claimed in claim 1, wherein a heat-conducting through-hole is bored in the heat-radiating ceramic base plate, and an aluminum material is charged in said through-hole.

5. A highly heat-radiating ceramic package as claimed in claim 1, wherein a plurality of I/O pins are bonded to the other surface of the multilayer ceramic wiring board with an Al-Si brazing material.

6. A highly heat-radiating ceramic package which comprises a multi-layer alumina wiring board bonded to an aluminum plate using an Al-Si brazing material, and said aluminum plate is bonded to a heat-radiating alumina base plate using an Al-Si brazing material, wherein said aluminum plate is between said multi-layer alumina wiring board and said heat-radiating alumina base plate.

7. A highly heat-radiating ceramic package as claimed in claim 6, wherein the thickness of the aluminum plate is 10–200% of the thickness of said heat-irradiating alumina base plate.

8. A highly heat-radiating ceramic package as claimed in claim 6, wherein a heat-radiating fin made of an aluminum material is bonded to the heat-radiating surface of said heat-radiating alumina base plate with an Al-Si brazing material.

9. A highly heat-radiating ceramic package as claimed in claim 6, wherein a plurality of I/O pins are bonded to the other surface of said multi-layer alumina wiring board with an Al-Si brazing material.

* * * * *